(12) United States Patent
Lambert et al.

(10) Patent No.: US 6,434,660 B1
(45) Date of Patent: Aug. 13, 2002

(54) EMULATING ONE TAPE PROTOCOL OF FLASH MEMORY TO A DIFFERENT TYPE PROTOCOL OF FLASH MEMORY

(75) Inventors: Grady Lambert, Clearwater, FL (US); Craig Henricksen, Berkeley, CA (US); Jonathan Minko, Arlington, MA (US)

(73) Assignee: Centennial Technologies, Inc., Wilmington, MA (US)

( * ) Notice: Subject to any disclaimer, the term of this patent is extended or adjusted under 35 U.S.C. 154(b) by 0 days.

(21) Appl. No.: 09/577,283

(22) Filed: May 23, 2000

(51) Int. Cl.[7] .............................................. G06F 12/00
(52) U.S. Cl. .................... 711/103; 365/185.33; 710/11; 710/105; 703/21; 703/22; 703/23; 703/25; 703/26; 703/27
(58) Field of Search ........................... 711/103; 710/11, 710/4, 105; 365/185.33; 703/21, 22, 23, 25, 26, 27

(56) References Cited

U.S. PATENT DOCUMENTS

| | | | | |
|---|---|---|---|---|
| 5,473,765 A | * | 12/1995 | Gibbons et al. | ............... 703/24 |
| 5,835,936 A | * | 11/1998 | Tomioka et al. | ............. 711/103 |
| 5,901,330 A | * | 5/1999 | Sun et al. | ........................ 710/8 |
| 5,940,627 A | * | 8/1999 | Luciani et al. | ................. 710/14 |
| 6,147,774 A | * | 11/2000 | Hamadani et al. | .......... 358/442 |
| 6,182,162 B1 | * | 1/2001 | Estakhri et al. | ................ 710/11 |
| 6,243,838 B1 | * | 6/2001 | Liu et al. | ...................... 714/57 |
| 6,279,069 B1 | * | 8/2001 | Robinson et al. | ........... 711/103 |

* cited by examiner

*Primary Examiner*—Do Hyun Yoo
*Assistant Examiner*—Jasmine Song
(74) *Attorney, Agent, or Firm*—Lyon & Lyon LLP

(57) ABSTRACT

A flash memory controller translates between manufacturer-specific protocols to allow the flash memories of one manufacturer to be used transparently in a host system programmed for the memory devices of different manufacturer. According to the invention, the controller indicates the manufacturer's ID code the host system requires irrespective of the flash memories used. The scheme employed permits translation even when there is no one-to-one correspondence between the parts of the different protocols being used.

43 Claims, 3 Drawing Sheets

EMULATING ONE TAPE PROTOCOL OF FLASH MEMORY TO A DIFFERENT TYPE PROTOCOL OF FLASH MEMORY

BACKGROUND OF THE INVENTION

1. Field of the Invention

The invention relates to flash memory cards and particularly to flash memory cards that can emulate the protocol of one type of flash memory using flash memory devices conforming to a different protocol.

2. Background

Linear flash memory devices have enjoyed wide and growing popularity in devices such as flash memory cards, combination devices such as flash/modem PC cards, and embedded systems such as routers, hubs, switches used in networks. Flash memories are solid state chips that can store data without requiring power to retain their data. Thus, they are often used in places where one might otherwise use a hard disk of a floppy disk to store data. However, because they are solid state devices, they are more rugged and can be made into very small sizes. One example is the very popular linear flash memory PCMCIA card.

Referring to FIG. 1, the basic components of flash memory devices are a controller 110 and one or more flash memory chips 120. A host device 100 reads or writes data from/to the flash memory chip 120 via an interface 105 such as a PCMCIA interface, USB, or any other device. The accessing of the desired memory part of the memory inside the flash memory chip 120 that contains the desired data is called "addressing." In prior art flash memory devices, the controller ordinarily simply frames and queues addressing signals so that the flash memories receive them in the correct format. Advanced flash devices can provide further functionality to the controller, for example, by keeping a record of bad memory cells and remapping addresses for those bad cells, by eliminating errors in bad cells using error correcting codes, by load leveling to spread wear over all cells of the flash memory.

There is a set of steps that must be done for a host computer to address a given part of the memory. These steps are performed by two sets of components: the controller 110 on the device, such as the flash PC card, and addressing hardware (not shown) in the flash memory chips themselves 120. To read or write data, besides the data involved (e.g., a series of bits that represents the character "A,") the host system 100 has to generate a command, for example, a command to read from a particular memory location on the flash chip 120. Flash chips are currently made to understand two sets of commands, which the controller can generate. One set of commands is standard (called "Command-Command Interface" or "CCI") and most manufacturers provide support for this set of commands. Another set of commands is specific to the manufacturer of the flash chips, and if a controller is designed to generate the commands for a particular manufacturer, the controller cannot be used with another manufacturer's chips. Also, sometimes device manufacturers design their systems (the "host" systems, which are the ones the flash cards are plugged into) to use the specific command set of the manufacturer to achieve extended capabilities or higher speed that are available from the manufacturer-specific command protocol. However, this has the disadvantage that it locks the card manufacturer into a particular flash manufacturer's specification so long as the card manufacturer is supplying cards to the host system manufacturer. Thus, the card manufacturer is prevented from switching to a different supplier of flash memory chips, should cost performance characteristics of that different supplier make that an attractive option.

One type of flash memory device that translates between one type of command and another type of command is an ATA-type controller. The host applies block-level commands to the flash device and an internal controller translates these to linear addresses. Thus, in such translations, the numbers of input and output address signal lines may differ on each side of the translation.

SUMMARY OF THE INVENTION

The invention provides a translator inside a flash memory controller that translates commands from a host system conforming to the protocol of one flash chip manufacturer into commands that are recognized by the flash chips of another manufacturer. The result is that host system manufacturers may design systems to use the extended capabilities of a particular flash chip manufacture's command set knowing that the chip's of another manufacturer could be substituted in the flash memory cards the host system accepts. This allows the supplier of the cards to supply cards with the highest possible cost/performance ratio.

One of the issues facing the designer of an interface is that there is that there is rarely a one-to-one correspondence of states between the state-machine of one protocol and another. Thus, translating commands from one device to emulate another can present problems. Another source of difficulty is when the host is designed to expect certain responses at a certain time. If there is a delay, the host may never believe a valid response may be forthcoming.

There are conditions that can help to get around these difficulties. First, commands from one protocol can be delivered to a controller while the controller isolates the flash memory from the host. After the commands of protocol 1 are received and validated as a recognized command, the controller can generate the commands using the second protocol. This is a robust mechanism for working around the lack of a one-to-one correspondence between states during command and argument-passing from the host to the controller and what would otherwise exist if the controller were simply addressing the flash memory directly. Second, the flash memory that is used to substitute for the one the host is programmed to expect should be faster than the latter. In this way, the time lag between host sending commands to the controller and the controller generating new commands in tandem, then waiting for the response is not very great. Where possible, if a portion of the protocol 2 command can be generated before a complete protocol 1 command is validated by the controller, one or more bus cycles can be saved. In this case, if the protocol 1 command is invalid, the controller can deliberately force a invalid command that would reset the flash memory receiving the protocol 2 command.

The invention will be described in connection with certain preferred embodiments, with reference to the following illustrative figures so that it may be more fully understood. With reference to the figures, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to

DETAILED DESCRIPTION OF THE PREFERRED EMBODIMENTS

Figure 1:
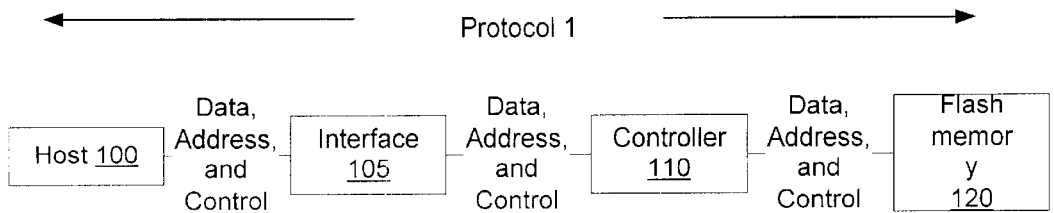
FIG. 1 is block diagram of the functional components of a prior art flash memory device such as a PCMCIA flash card.
Figure 2A:
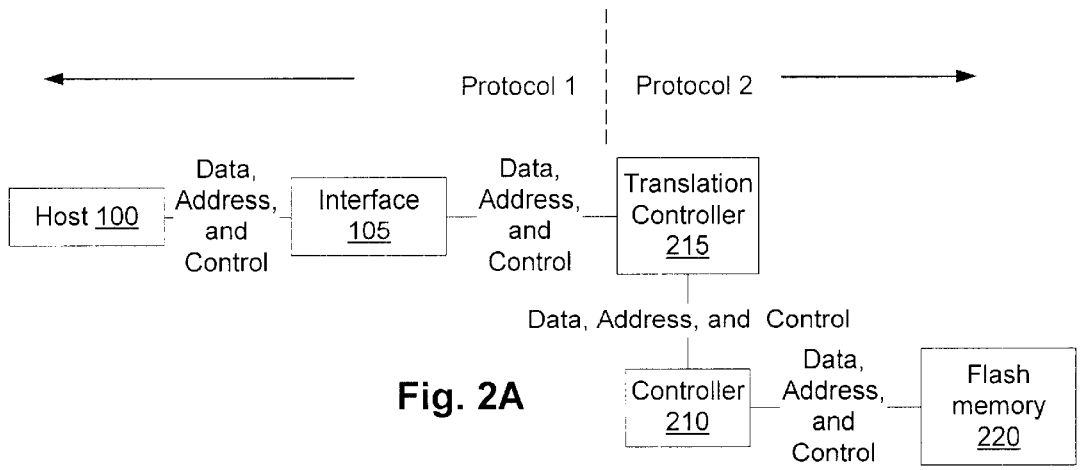
FIG. 2A is a block diagram of the functional components of a flash memory device, such as a PCMCIA flash card, according to an embodiment of the invention.

Referring to FIG. 2A, a translation controller 215 translates control signals that include data, address, and control signals from a first to a second protocol. The protocol 2 commands are thus generated and applied to the conventional controller 210. Thus, a flash memory 220 that conforms to one protocol can be used in a device that is usable with a host programmed to interface with flash memories conforming to a different protocol. Controller 210 could be an ASIC, a programmable processor, an FPGA, or any other suitable device.

Figure 2B:
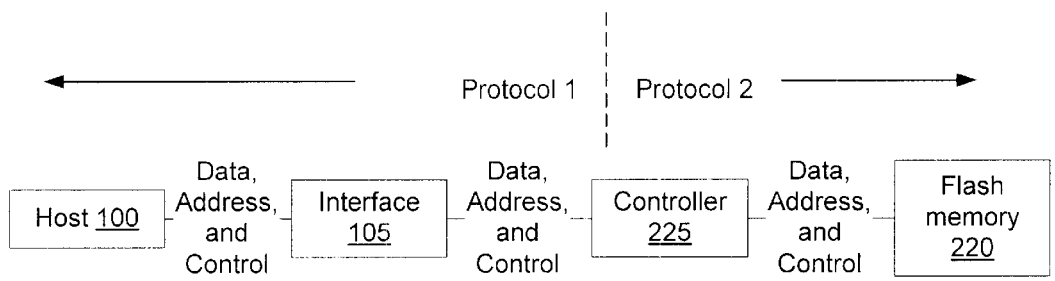
FIG. 2B is a block diagram of the functional components of a flash memory device, such as a PCMCIA flash card, according to another embodiment of the invention.

Referring now to FIG. 2B, the translation and conventional control functions can be combined in a single controller device 225.

Figure 3:
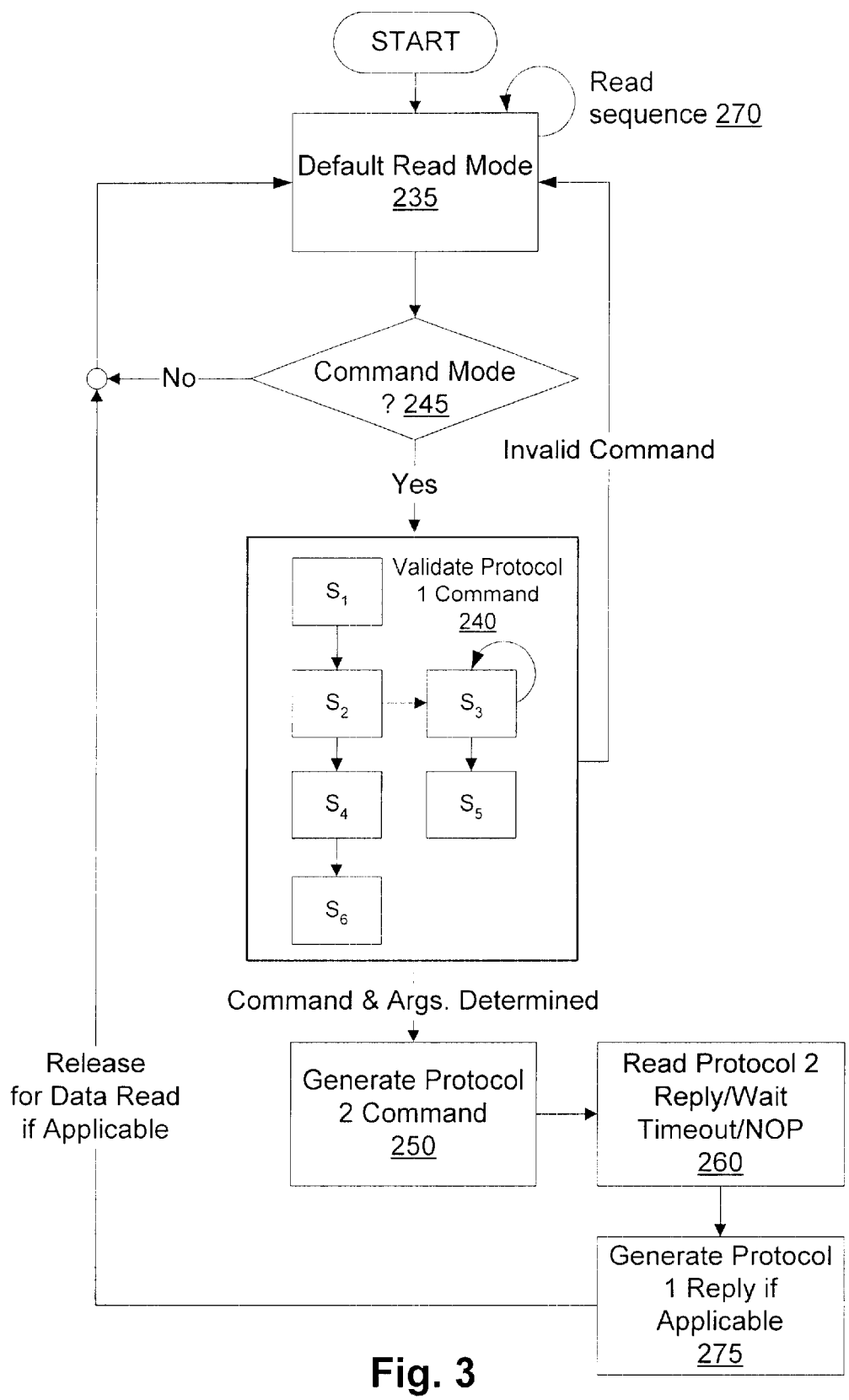
FIG. 3 is a state diagram illustrating the process of translation of commands of one protocol to commands of another protocol according to an embodiment of the invention.

Referring now to FIG. 3, the state machine within the translation controller 215 is represented by a flow diagram that begins in a default read mode 235. Each state is separated from an upstream state by one clock cycle. During a clock cycle, a part of a command may be received and the data in that part determines which transition is followed in the state diagram. The actual state diagram shown in completely figurative and is only intended to suggest the process of parsing the protocol 1 command until a specific command has been identified.

Beginning at the top of the flow diagram, most of the time, flash memory devices are used for reading. In addition, when a read operation is performed, generally there is no problem with matching states of the memory device with the protocol used by the host. That is, the controller can simply pass signals through by merely framing and queuing the address to provide addressing in a fashion that involves no translation steps. This is indicated at 270.

If a command such as a sector erase, chip erase, program, manufacturer inquiry, etc. the command is validated according to logic that is specific to protocol 1 in step 240. That is, in step 240 a procedure is executed the result of which is to determine the specific command and argument data (e.g., an address) that must be sent to the protocol 2 flash memory to provide what the host 100 expects. If the command received is invalid, the flow is escaped and control returns to step 235. If a valid command is completely received, a corresponding command is generated under protocol 2 and applied to the signal lines of the flash memory in step 250. Then in step 260, data from the flash memory may be read, or a reply, or a time interval invoked. Alternatively at step 260 nothing (NOP) may be done, depending on the particular command and the nature of protocol 2. If a reply is required by protocol 1, that reply is then generated at step 275. Finally control returns to step 235.

Figure 4:
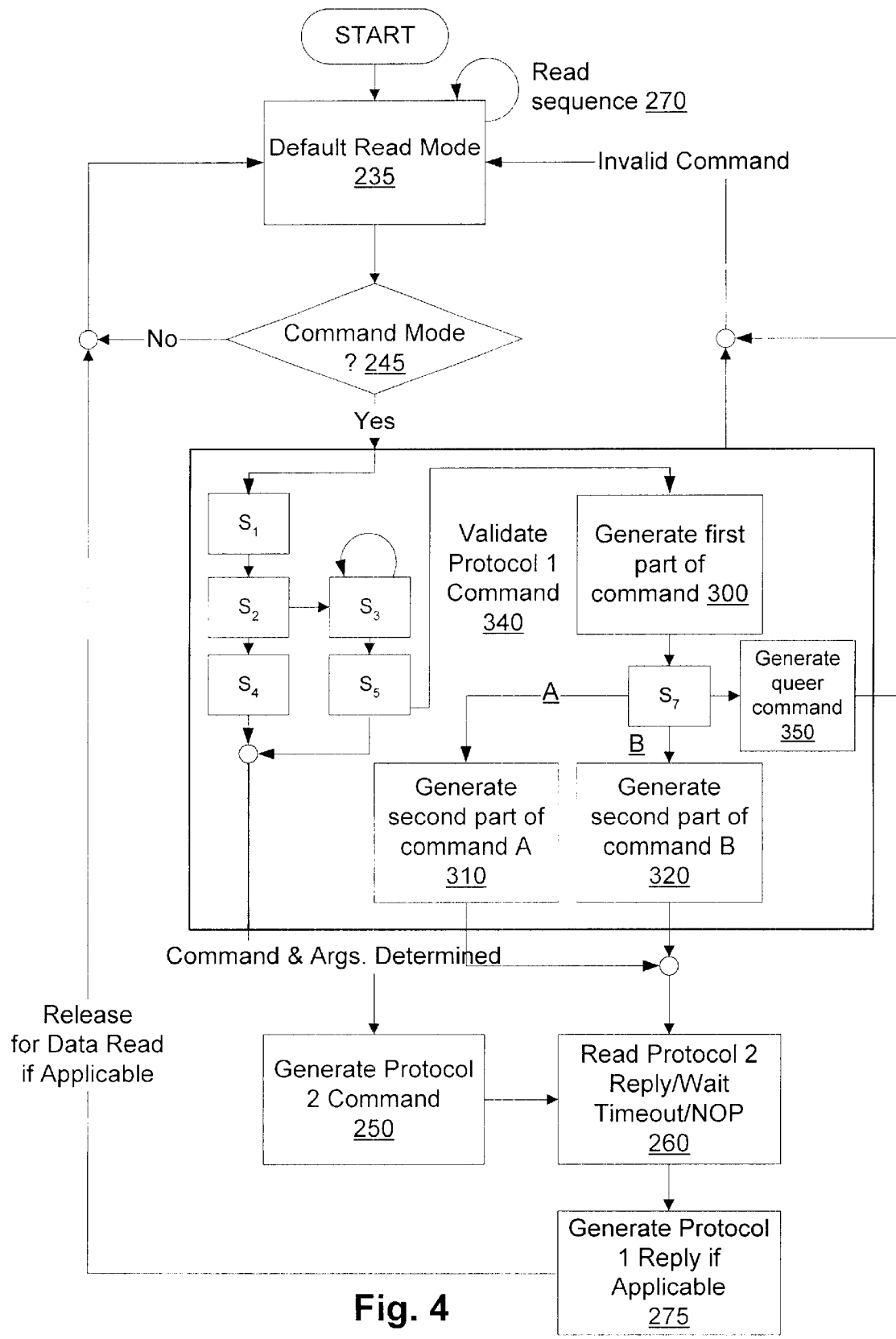
FIG. 4 is a state diagram illustrating the process of translation of commands of one protocol to commands of another protocol according to another embodiment of the invention.

Referring now to FIG. 4, to save time, which may be critical if the host is programmed to expect a response within a limited time, it may be possible to parse the command so that part of a protocol 2 command is generated while the protocol 1 command is further parsed. In the embodiment of FIG. 4, it is determined at state S5 that the protocol 1 command, not all of which has been received at state S5, corresponds to one of two protocol 1 commands (A and B), each of which has the same first part. To exploit this for time saving, after state S5, at step 300, the part of the protocol 1 command that is common to commands A and B is generated. Simultaneously, instantly thereafter (i.e., within the same clock cycle) the next part of the protocol 1 command is received in state S7 and which decides whether the next part of the protocol 2 command should be command A or command B. Control passes to step S310 or 320 depending on which.

The first part of the protocol 1 command may be good but the second part may prove the protocol 1 command as a whole invalid. Thus, one possibility at state S7 is that an invalid command will be identified in which case it is necessary to call off the first part. Since the first part of a protocol 2 command has been generated, the protocol 2 command must be "called off" and this can be accomplished in various ways, one of which is to generate an invalid protocol 2 second part "queer command" that will be rejected by the succeeding stage of the controller 210.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A flash memory controller, comprising:
   an input connected to receive commands from a host system;
   an output connected to a flash memory;
   said controller being configured to accept first commands conforming to a first protocol;
   said controller being further configured to generate second commands conforming to a second, different, protocol; and
   said second protocol including at least one command to erase or write at least one memory cell;
   both said first and second protocols being flash memory protocols;
   both said first and second protocols being a same one of linear and block addressing protocols.

2. A controller as in claim 1, wherein said one of linear and block addressing protocols is a linear addressing protocol.

3. A controller as in claim 1, wherein said controller is configured such that a beginning of a command till a response from said flash memory is N bus cycles long, said first commands being received during n of said N bus cycles and said second commands being generated after said nth bus cycle.

4. A controller as in claim 3, wherein said controller is configured such as to generate a symbol identifying it as a flash memory conforming to said first protocol.

5. A controller as in claim 1, wherein said controller is configured such that a first protocol command to return a manufacturer's identifier is responded to by said controller with an identifier indicating said first protocol.

6. A controller as in claim 1, wherein at least one of said first protocol commands takes a different number of bus cycles to complete than corresponding one(s) of said second protocol commands.

7. A flash memory controller, comprising:
   an input connected to receive commands from a host system;
   an output connected to a flash memory;
   said controller being configured to accept first commands conforming to a first protocol during a first time period and to generate second commands conforming to a second, different, protocol during a second time period following said first time period, whereby said first protocol commands are translated into second protocol commands;
   both said first and second protocols being flash memory protocols; and
   said controller being further configured such that a first protocol command for reading a memory cell of said flash memory is not translated.

8. A controller as in claim 7, wherein said controller is further configured such as to translate data from said second protocol to said first protocol, whereby said flash memory is indistinguishable from a first protocol flash memory to said host system.

9. A flash memory controller, comprising:
   an input connected to receive commands from a host system;
   an output connected to a flash memory;
   said controller being configured to accept first commands conforming to a first protocol suitable for linearly addressing a memory space of a flash memory device during a first time period and to generate second commands conforming to a second, different, protocol during a second time period following said first time period, whereby said first protocol commands are translated into second protocol commands;
   both said first and second protocols being flash memory protocols; and
   said controller being further configured such that a first protocol command for reading a memory cell of said flash memory is not translated.

10. A method of addressing a flash memory conforming to a second protocol using a first protocol, comprising the steps of:
    generating a first protocol command at a first computer, said first protocol command being at least one of an erase and a write command to erase or write a memory cell of a flash memory;
    said first protocol including at least one linear addressing command;
    applying said first protocol command to a controller;
    translating at said controller said first protocol command to a second protocol command; and
    applying a second protocol command resulting from said step of translating to said flash memory, wherein both said first and second protocols are flash memory protocols.

11. A controller as in claim 10, wherein said step of translating includes receiving at least two parts of said first protocol command during first successive bus cycles and generating corresponding second protocol commands during second successive bus cycles following said first.

12. A flash memory controller, comprising:
    an input connected to receive commands from a host system via a flash memory interface;
    an output connected to a flash memory;
    said controller being configured to accept first commands conforming to a first protocol;
    said controller being further configured to generate second commands conforming to a second, different, protocol; and
    said second protocol including at least one command to erase or write at least one memory cell;
    both said first and second protocols being flash memory protocols;
    both said first and second protocols being a same one of linear and block addressing protocols.

13. A controller as in claim 12, wherein said one of linear and block addressing protocols is a linear addressing protocol.

14. A controller as in claim 12, wherein said controller is configured such that a beginning of a command till a response from said flash memory is N bus cycles long, said first commands being received during N of said N bus cycles and said second commands being generated after said Nth bus cycle.

15. A controller as in claim 14, wherein said controller is configured such as to generate a symbol identifying it as a flash memory conforming to said first protocol.

16. A controller as in claim 12, wherein said controller is configured such that a first protocol command to return a manufacturer's identifier is responded to by said controller with an identifier indicating said first protocol.

17. A controller as in claim 12, wherein at least one of said first protocol commands takes a different number of bus cycles to complete than corresponding one(s) of said second protocol commands.

18. A flash memory controller, comprising:
    an input connected to receive flash memory commands from a host system;
    an output connected to a flash memory;
    said controller being configured to accept first commands conforming to a first protocol;
    said controller being further configured to generate second commands conforming to a second, different, protocol; and
    said second protocol including at least one command to erase or write at least one memory cell;
    both said first and second protocols being flash memory protocols;
    both said first and second protocols being a same one of linear and block addressing protocols.

19. A controller as in claim 18, wherein said one of linear and block addressing protocols is a linear addressing protocol.

20. A controller as in claim 18, wherein said controller is configured such that a beginning of a command till a response from said flash memory is N bus cycles long, said first commands being received during N of said N bus cycles and said second commands being generated after said Nth bus cycle.

21. A controller as in claim 20, wherein said controller is configured such as to generate a symbol identifying it as a flash memory conforming to said first protocol.

22. A controller as in claim 18, wherein said controller is configured such that a first protocol command to return a manufacturer's identifier is responded to by said controller with an identifier indicating said first protocol.

23. A controller as in claim 18, wherein at least one of said first protocol commands takes a different number of bus cycles to complete than corresponding one(s) of said second protocol commands.

24. A flash memory translation controller for translating commands from a first flash memory protocol to a second flash memory protocol, comprising:

a translation controller in a host system;

an input from said host system, said input being connected to said translation controller and capable of transferring to said translation controller a first signal conforming to a first protocol;

an output to a flash memory controller, said output being connected to said translation controller and capable of transferring to said flash memory controller a second signal conforming to a second protocol;

said first protocol and said second protocol being different flash memory protocols;

said translation controller being capable of translating said first signal conforming to a first protocol into said second signal conforming to a second protocol, wherein said first signal and said second signal denote the same command function.

25. The translation controller of claim 24, wherein said flash memory controller is a member selected from the group consisting of an ASIC, a programmable processor and an FPGA.

26. The translation controller of claim 24, wherein said translation controller and said flash memory controller are combined in a single controller device.

27. The translation controller of claim 24, wherein each of said first and second signals is the same of a data, address or control signal.

28. The translation controller of claim 24, wherein each of said first protocol and said second protocol is the same one of a linear addressing protocol and a block addressing protocol.

29. The translation controller of claim 24, wherein each of said first protocol and said second protocol is a linear addressing protocol.

30. The translation controller of claim 24, wherein said first protocol and said second protocol are different manufacturer-specific protocols.

31. A flash memory translation controller for translating commands from a first flash memory protocol to a second flash memory protocol, comprising:

in a host system, a means for translating flash memory signals of a first protocol into flash memory signals of a second protocol;

a means for inputting said translating said flash memory signals of said first protocol into said means for translating flash memory signals;

a means for outputting said flash memory signals of said second protocol to a flash memory controller;

said first protocol and said second protocol being different flash memory protocols.

32. The translation controller of claim 31, wherein said flash memory controller is a member selected from the group consisting of an ASIC, a programmable processor and an FPGA.

33. The translation controller of claim 31, wherein said means for translating flash memory signals of said first protocol into flash memory signals of said second protocol and said flash memory controller are combined in a single controller device.

34. The translation controller of claim 31, wherein each of said flash memory signals of said first protocol and said flash memory signals of said second protocol is the same of a data, address or control signal.

35. The translation controller of claim 31, wherein each of said first protocol and said second protocol is the same one of a linear addressing protocol and a block addressing protocol.

36. The translation controller of claim 31, wherein each of said first protocol and said second protocol is a linear addressing protocol.

37. The flash memory controller of claim 31, further comprising a means for parsing said flash memory signal of said first protocol until a specific command is identified.

38. The flash memory controller of claim 31, further comprising a means for generating all or a portion of said flash memory signal of said second protocol after parsing a portion of said flash memory signal of said first protocol.

39. The flash memory controller of claim 31, wherein said first protocol and said second protocol are different manufacturer-specific protocols.

40. A method for translating commands from a first flash memory protocol to a second flash memory protocol, comprising the steps of:

(a) providing a flash memory translation controller, said flash memory translation controller being capable of translating commands from a first protocol to a second protocol, said first protocol and said second protocol being different flash memory protocols;

(b) inputting, from a host device to said flash memory translation controller, a first signal conforming to said first protocol, said first signal denoting a command from said host device;

(c) translating said first signal into a second signal conforming to said second protocol, said second signal denoting said command; and (d) outputting said second signal from said flash memory translation controller to a flash memory controller.

41. The method of claim 40, further comprising isolating said flash memory controller from said host device.

42. The method of claim 40, wherein said second signal is output to said flash memory controller after said first signal is completely translated into said second signal.

43. The method of claim 40, wherein said second signal is output to said flash memory controller before said first signal is completely translated into said second signal.

* * * * *

UNITED STATES PATENT AND TRADEMARK OFFICE
CERTIFICATE OF CORRECTION

PATENT NO.    : 6,434,660 B1
DATED         : August 13, 2002
INVENTOR(S)   : Grady Lambert, Craig Henricksen and Jonathan Minko It is certified that error appears in the above-identified patent and that said Letters Patent is hereby corrected as shown below:

<u>Title page,</u>
Item [54], should read -- EMULATING ONE TYPE PROTOCOL OF FLASH MEMORY TO A DIFFERENT TYPE PROTOCOL OF FLASH MEMORY --.

Signed and Sealed this

Twenty-fifth Day of March, 2003

JAMES E. ROGAN
*Director of the United States Patent and Trademark Office*